(12) United States Patent
McPartland et al.

(10) Patent No.: US 6,459,615 B1
(45) Date of Patent: Oct. 1, 2002

(54) NON-VOLATILE MEMORY CELL ARRAY WITH SHARED ERASE DEVICE

(75) Inventors: Richard Joseph McPartland, Nazareth, PA (US); Ranbir Singh, Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/910,980

(22) Filed: Jul. 23, 2001

(51) Int. Cl.$^7$ .............................................. G11C 16/04
(52) U.S. Cl. ............................... 365/185.1; 365/185.29
(58) Field of Search ....................... 365/185.01, 185.05, 365/185.11, 185.29, 185.33, 185.1

(56) References Cited

U.S. PATENT DOCUMENTS

| | | | |
|---|---|---|---|
| 5,465,231 A | 11/1995 | Ohsaki et al. | 365/185.33 |
| 5,659,504 A | 8/1997 | Bude et al. | 365/185.18 |
| 5,740,106 A * | 4/1998 | Nazarian | 365/185.29 |
| 5,838,617 A | 11/1998 | Bude et al. | 365/185.18 |
| 5,949,710 A * | 9/1999 | Pass et al. | 365/185.05 |
| 6,002,610 A | 12/1999 | Cong et al. | 365/185.05 |
| 6,011,722 A | 1/2000 | Bude et al. | 365/185.18 |
| 6,191,980 B1 * | 2/2001 | Kelly et al. | 365/185.29 |
| 6,324,095 B1 * | 11/2001 | McPartland et al. | 365/185.05 |

OTHER PUBLICATIONS

R.J. McPartland et al., "SRAM Embedded Memory with Low Cost, FLASH EEPROM–Switch–Controlled Redundancy," Proceedings of the IEEE Custom Integrated Circuits Conference, Orlando, Florida, May 21–24, 2000, pp. 287–289.
R.J. McPartland et al., "1.25 Volt, Low Cost, Embedded FLASH Memory for Low Density Applications," Proceedings of the 2000 Symposium on VLSI Circuits, Honolulu, Hawaii, Jun. 15–17, 2000, pp. 158–161.

* cited by examiner

Primary Examiner—Trong Phan
(74) Attorney, Agent, or Firm—Ryan, Mason & Lewis, LLP

(57) ABSTRACT

A non-volatile memory device is disclosed which includes an erase device that is shared among an array of memory cells. Each of the memory cells in the array includes a control device coupled to a switch device via a common floating gate. Each of at least a subset of the memory cells further includes a portion of the shared erase device, the portion of the shared erase device associated with a given one of the memory cells being coupled to the switch device of that cell via the floating gate of that cell. The shared erase device is utilizable in performing an erase operation for each of the memory cells associated therewith. Advantageously, the use of the shared erase device substantially reduces the circuit area requirements of the memory array. The invention is particularly well suited for implementation in single-poly flash EEPROM embedded memory devices in integrated circuit applications.

11 Claims, 5 Drawing Sheets

100

100

NON-VOLATILE MEMORY CELL ARRAY WITH SHARED ERASE DEVICE

FIELD OF THE INVENTION

The present invention relates generally to electronic memory devices, and more particularly to arrays of non-volatile memory cells for use in electronic memory devices such as electrically erasable programmable read-only memories (EEPROMs).

BACKGROUND OF THE INVENTION

A non-volatile memory device is capable of retaining stored information after disconnection of its power source. An EEPROM is a type of non-volatile memory device in which information is written to and erased from the memory cells thereof using an electrical signal. EEPROMs are often implemented as "flash" memory devices in which all memory cells or designated sectors of cells can be simultaneously erased. Such devices typically utilize floating gate transistor structures in which the floating gate used to store charge upon programming of the cell is formed from a single layer of polysilicon. These single-poly flash EEPROMs are particularly well suited for use in applications requiring embedded, low cost, medium density arrays of non-volatile memory cells, such as parameter, protocol, code and data storage for processors and other types of integrated circuits.

Examples of single-poly flash EEPROM memory cells known in the art are described in U.S. Pat. No. 6,191,980, issued Feb. 20, 2001 in the name of inventors P. J. Kelley et al. and entitled "Single-Poly Non-Volatile Memory Cell Having Low-Capacitance Erase Gate," R. J. McPartland et al., "SRAM Embedded Memory with Low Cost, FLASH EEPROM-Switch-Controlled Redundancy," Proceedings of the IEEE Custom Integrated Circuits Conference, Orlando, Fla., May 21–24, 2000, pp. 287–289, and R. J. McPartland and R. Singh, "1.25 Volt, Low Cost, Embedded FLASH Memory for Low Density Applications," Proceedings of the 2000 Symposium on VLSI Circuits, Honolulu, Hawaii, Jun. 15–17, 2000, pp. 158–161, all of which are incorporated by reference herein.

FIG. 1 shows a schematic diagram of a single-poly flash EEPROM memory cell 100 of the type described in the above-cited U.S. Pat. No. 6,191,980. The memory cell 100 includes a control device M1 in the form of a control gate capacitor, a switch device M2, and an erase device M3. M1 and M3 are implemented as P-type metal oxide semiconductor (PMOS) devices, and M2 is implemented as an N-type MOS (NMOS) device. The control device M1, switch device M2 and erase device M3 all share a common polysilicon floating gate 102 designed to retain charge after the cell is written, i.e., programmed.

Programming in the memory cell 100 is by hot electron injection and erasure is by Fowler-Nordheim (F-N) tunneling. In operation, the cell is written or programmed by applying a voltage of about 5 volts to control gate 104 while drain terminal 108 of M2 is about 5 volts and erase gate 106 and source terminal 10 of M2 are held at about 0 volts, and the cell is erased by applying a voltage of about 10 volts to erase gate 106 while control gate 104 and terminals 108 and 110 are held to about 0 volts.

The object of an erase operation is to raise the potential of the floating gate 102 such that when the floating gate is coupled to the control gate 104 during a subsequent read operation, the potential of the floating gate will be above the threshold of the switch device M2 and M2 will thereby be conductive. Tunneling of electrons from the floating gate 102 through the gate oxide layer of device M3 associated therewith to source/drain and N-well regions of device M3 raises the potential of the floating gate. In a program operation, the potential of the floating gate 102 is lowered by the above-noted hot electron injection such that when the floating gate is coupled to the control gate 104 during a subsequent read operation, the potential of the floating gate will be below the threshold of the switch device M2 and M2 will thereby be non-conductive.

FIG. 2 shows a topological view of the memory cell 100. The device 100 includes N-well regions 120 and 122 formed in a P-type substrate. Devices M1 and M3 are formed in the N-well regions 120 and 122, respectively, while device M2 is formed in an N-type source-drain implant region 124. P-type source-drain implant regions 126 and 128 are formed in the respective N-well regions 120 and 122. Thin oxide or "thinox" regions 130 and 132 are associated with the respective devices M1 and M2, while thinox source/drain contact regions 134 and 136 are associated with the device M3. An additional thinox region 137 is present between the regions 134 and 136. Windows 131-1 and 131-2 are formed in the thinox region 130, and similar windows are formed in the thinox regions 132 and 134. Elements 140 and 142 associated with the respective N-well regions 120 and 122 are N-well ties each having a window formed therein. Element 144 is a P-well tie associated with the P-type substrate.

FIGS. 3A and 3B show respective topological and side sectional views of the erase device M3 in the conventional memory cell 100. The FIG. 3B sectional view is taken along the line B—B' shown in FIG. 3A. It can be seen from FIG. 3A that the floating gate 102 overlies the thinox region 137. The N-well tie 142 of FIG. 3A is formned in a P-type substrate 160 and corresponds to a region 162 in the N-well 122. Source/drain contact regions 134 and 136 correspond to source/drain regions 164 and 166 in the N-well 122. As is apparent from the schematic diagram of FIG. 1, both the source/drain regions 164, 166 and the N-well tie region 162 are electrically connected together to form one terminal (i.e., erase gate 106) of the erase device M3. The other terminal of the erase device M3 is the floating gate 102. The erase operation in the memory cell 100 involves tunneling of electrons from the floating gate 102 to the source/drain and N-well tie regions, via the above-noted F-N tunneling effect.

A potential drawback of the memory cell 100 is the amount of circuit area required to implement the erase device M3. More particularly, the erase device M3 of the memory cell 100 as illustrated in FIGS. 3A and 3B includes the N-well tie region 162 and two source/drain regions 164, 166, which collectively occupy a substantial amount of area within the memory cell 100. In addition, when multiple memory cells of this type are combined into a memory cell array, the erase device M3 is replicated in fail for each of the memory cells, further increasing the area requirements. For example, an array of eight non-volatile memory cells would conventionally require eight separate erase devices having a total of sixteen source/drain contacts and eight N-well tie contacts. However, in order to minimize fabrication costs for the corresponding memory device, it is desirable to reduce the memory cell area. A need therefore exists in the art for a non-volatile memory cell and associated cell array having an erase device structure which requires less area than the conventional arrangements previously described.

SUMMARY OF THE INVENTION

The present invention overcomes the above-described drawback of the prior art by providing a non-volatile memory device in which an array of memory cells share an erase device.

In accordance with one aspect of the invention, a non-volatile memory device includes an erase device that is shared among an array of memory cells. Each of the memory cells includes a control device coupled to a switch device via a common floating gate. Each of at least a subset of the memory cells further includes a portion of the shared erase device, the portion of the shared erase device associated with a given one of the memory cells being coupled to the switch device of that cell via the floating gate of that cell. The shared erase device is utilizable in performing an erase operation for each of the memory cells associated therewith.

In an illustrative embodiment of the invention, a non-volatile memory cell array includes eight memory cells, and the shared erase device is configured so as to be shared among the eight memory cells. More particularly, the eight memory cells may be configured in two groups of four cells each, with the shared erase device being arranged in a region of the device between the two groups of cells, and the floating gates associated with each of the cells extending into the region and forming elements of the shared erase device. Thus, in accordance with the techniques of the invention, an array of eight non-volatile memory cells which would conventionally require eight separate erase devices having a total of sixteen source/drain contacts and eight N-well tie contacts is instead configured to utilize a single shared erase device having only two source/drain contacts and one N-well tie contact.

Advantageously, the shared erase device structure of the present invention substantially reduces the area required to implement a memory device comprising one or more arrays of non-volatile memory cells. By way of example, a memory cell array fabricated in accordance with the above-noted illustrative embodiment of the invention has a memory cell size of 1.28 $\mu$m×10.56 $\mu$m (13.5 $\mu$m$^2$), representing a cell area reduction of about 80% relative to a conventional memory cell.

The invention is particularly well suited for implementation in single-poly flash EEPROM embedded memory devices in integrated circuit applications, but can also be used in other applications.

DETAILED DESCRIPTION OF THE INVENTION

The present invention will be illustrated herein using exemplary non-volatile memory cell circuits implemented using complementary metal oxide semiconductor (CMOS) circuit structures. It should be understood, however, that the invention is suitable for use with circuit structures other than those specifically described herein. For example, those skilled in the art will recognize that the conductivity types of the devices in a given circuit generally may be reversed, e.g., P-type devices may be replaced with N-type devices and vice versa. These and other modifications to the illustrative embodiments will be apparent to those skilled in the art.

Figure 4:
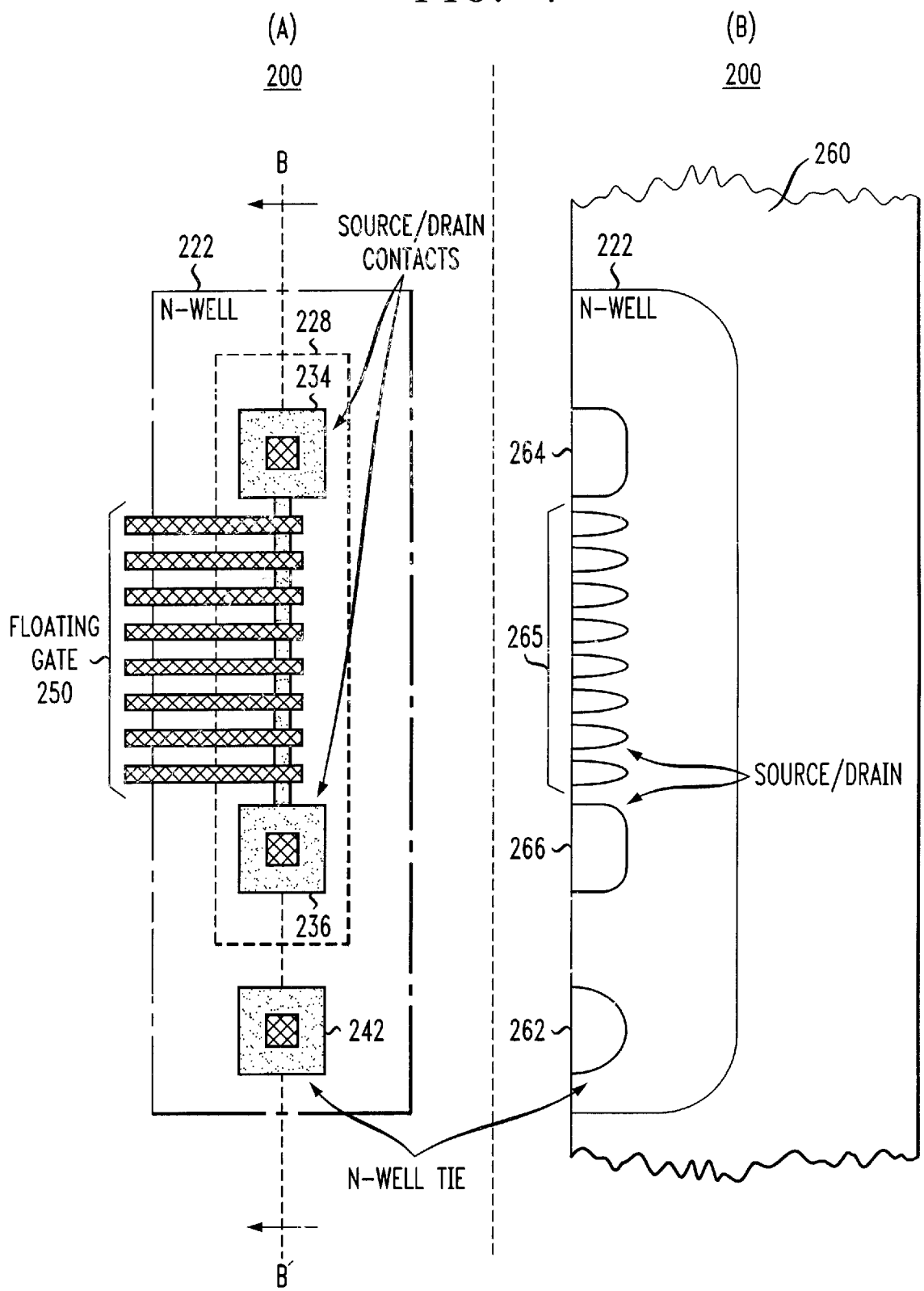
FIGS. 4A and 4B shows respective topological and side-sectional views of a shared erase device in accordance with the present invention.

FIGS. 4A and 4B show respective topological and side sectional views of a shared erase device 200 in accordance with an illustrative embodiment of the invention. The FIG. 4B sectional view is taken along the line B—B' shown in FIG. 4A. The erase device 200 in this embodiment is configured to be shared by an array of eight non-volatile memory cells, each of which may be implemented as an otherwise conventional non-volatile memory cell such as the memory cell 100 described in conjunction with FIG. 1.

Additional details regarding the conventional aspects of the operation of such cells and cell arrays can be found in the above-cited references U.S. Pat. No. 6,191,980, issued Feb. 20, 2001 in the name of inventors P. J. Kelley et al. and entitled "Single-Poly Non-Volatile Memory Cell Having Low-Capacitance Erase Gate," R. J. McPartland et al., "SRAM Embedded Memory with Low Cost, FLASH EEPROM-Switch-Controlled Redundancy," Proceedings of the IEEE Custom Integrated Circuits Conference, Orlando, Fla., May 21–24, 2000, pp. 287–289, and R. J. McPartland and R. Singh, "1.25 Volt, Low Cost, Embedded FLASH Memory for Low Density Applications," Proceedings of the 2000 Symposium on VLSI Circuits, Honolulu, Hawaii, Jun. 15–17, 2000, pp. 158–161. The conventional aspects of the operation of memory cells and cell arrays that may utilize a shared erase device in accordance with the invention are well known and will therefore not be further described herein.

The shared erase device 200 as shown in FIG. 4A includes an N-well region 222, source/drain contact regions 234 and 236, a P-type source/drain implant region 228, an N-well tie 242, and a set of floating gates 250. The N-well 222 is formed in a P-type substrate illustrated as substrate 260 in FIG. 4B. The source/drain contact regions 234 and 236 are thinox regions having windows therein and overlying the P-type source/drain implant region 228 in the N-well 222. The N-well tie 242 is a thinox region having a window therein and is formed over the a portion of the N-well 222. It should be noted that the term "N-tub" may also be used herein to refer to an N-well. These terms are considered to be interchangeable in the present description.

As noted above, the particular conductivity types in the illustrative embodiments of the invention are shown by way of example only. In other embodiments, the invention can be implemented using P-wells formed in an N-type substrate.

Each of the floating gates in the set of gates 250 is associated with a different memory cell in an array of memory cells that share the erase device 200. In this embodiment, as noted above, the erase device 200 is shared between eight memory cells, and it can be seen from FIG. 4A that there are eight distinct floating gates in the set 250.

As illustrated in FIG. 4B, the N-well 222 is formed in the P-type substrate 260 and includes a tie region 262 underlying N-well tie 242, source/drain regions 264 and 266 underlying respective source/drain contact regions 234 and 236, and additional source/drain regions 265 which in conjunction with the source/drain regions 264 and 266 define a set of eight erase device channels each associated with and controlled by one of the floating gates in the set of gates 250. The erase device 200 is thus shared between the eight memory cells of the array in the illustrative embodiment. In other words, a portion of the erase device 200 is associated with each of the cells of the array. More particularly, the portion of the erase device 200 associated with a given one of the cells may be coupled to a switch device such as device M2 of FIG. 1 via the floating gate of that cell, and is utilizable in performing an erase operation for that cell.

It should be noted that source/drain regions 265 adjacent to the innermost six of the eight floating gates 250 do not have source/drain contacts associated therewith. Electrical connection to the source/drain contacts 234,236 for each of these six gates therefore must be made through a series of intervening source/drain regions and associated thinox regions under the intervening floating gates. In order for this electrical connection to occur, the thinox regions under all of the intervening floating gates must be in inversion. During erasure, this condition is met because the gates are preferably biased at least about 10 volts below the source/drain regions, and thus well beyond the typical device threshold of 1.5 volts.

Figure 1:
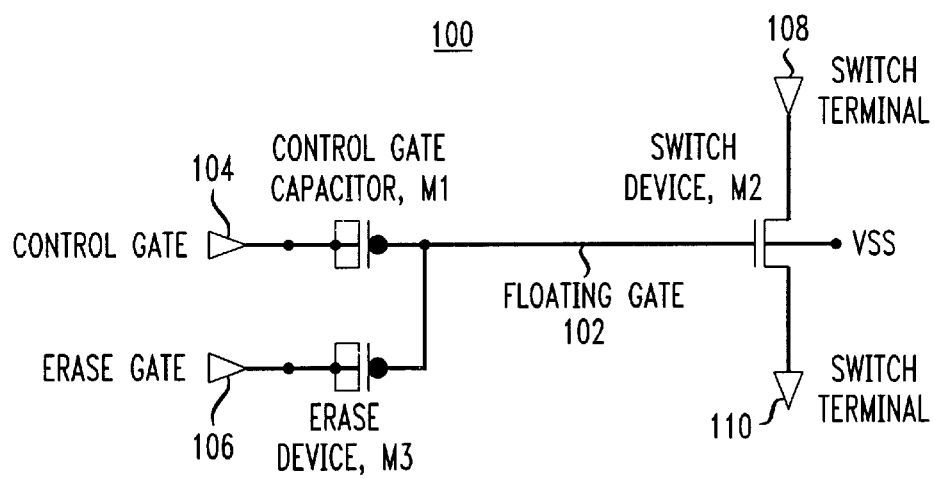
FIG. 1 is a schematic diagram of a conventional non-volatile flash EEPROM memory cell.
Figure 2:
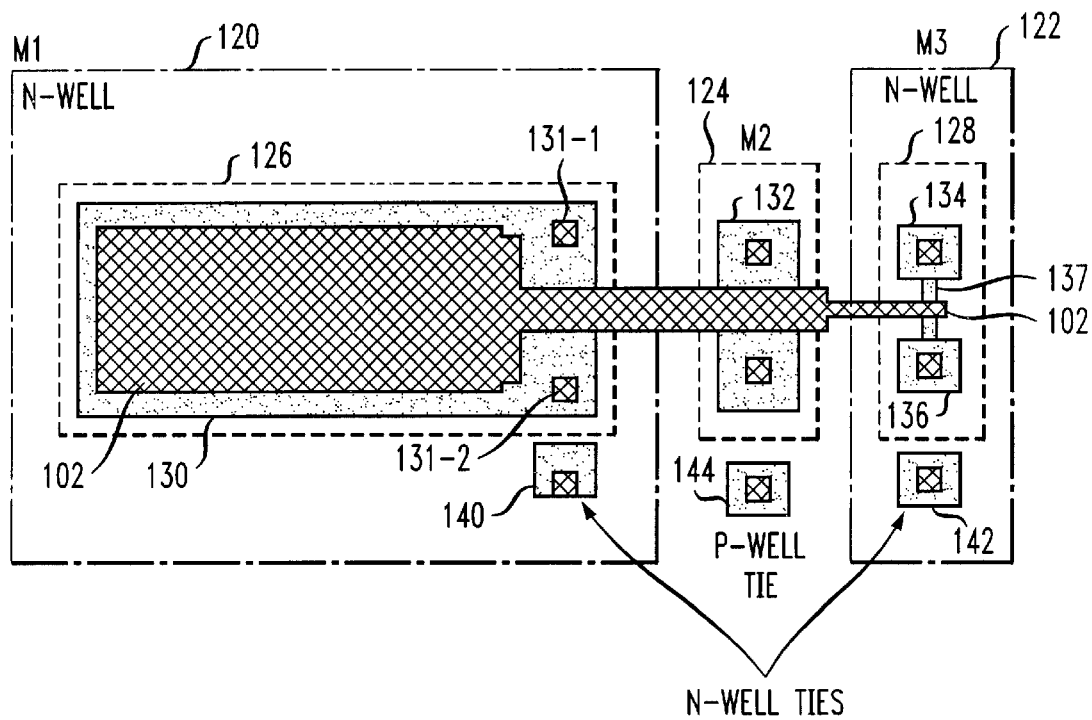
FIG. 2 is a topological diagram of the conventional memory cell of FIG. 1.
Figure 3:
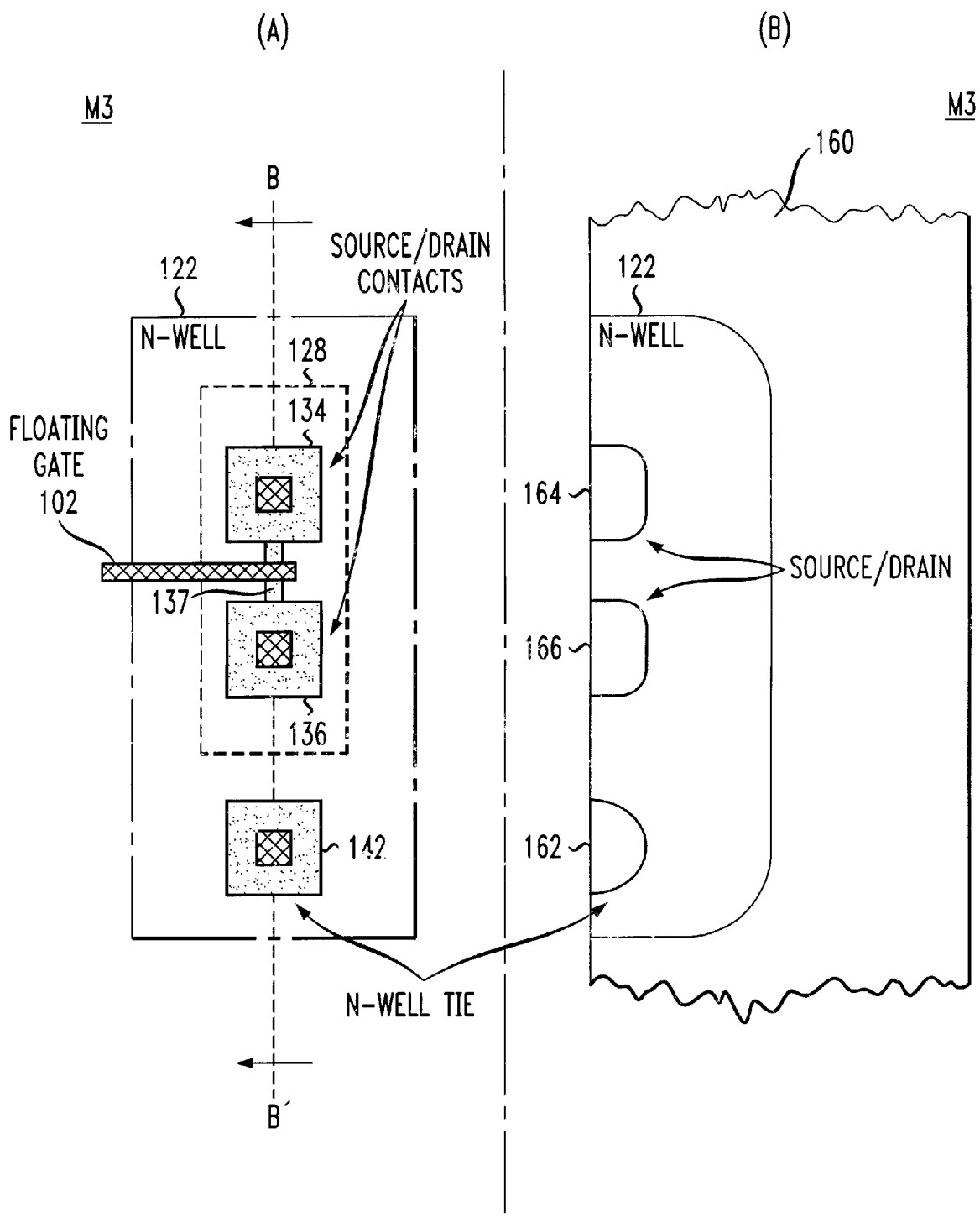
FIGS. 3A and 3B show respective topological and side-sectional views of an erase device in the conventional memory cell of FIG. 1.

As mentioned previously, the configuration of shared erase device 200 as shown in FIGS. 4A and 4B is suitable for use as a replacement for device M3 in each of the cells in an array of eight memory cells of the type shown in FIG. 1. Those skilled in the art will recognize, however, that numerous other configurations are also possible. An example of one such other configuration will be described below in conjunction with FIGS. 5, 6 and 7.

Figure 5:
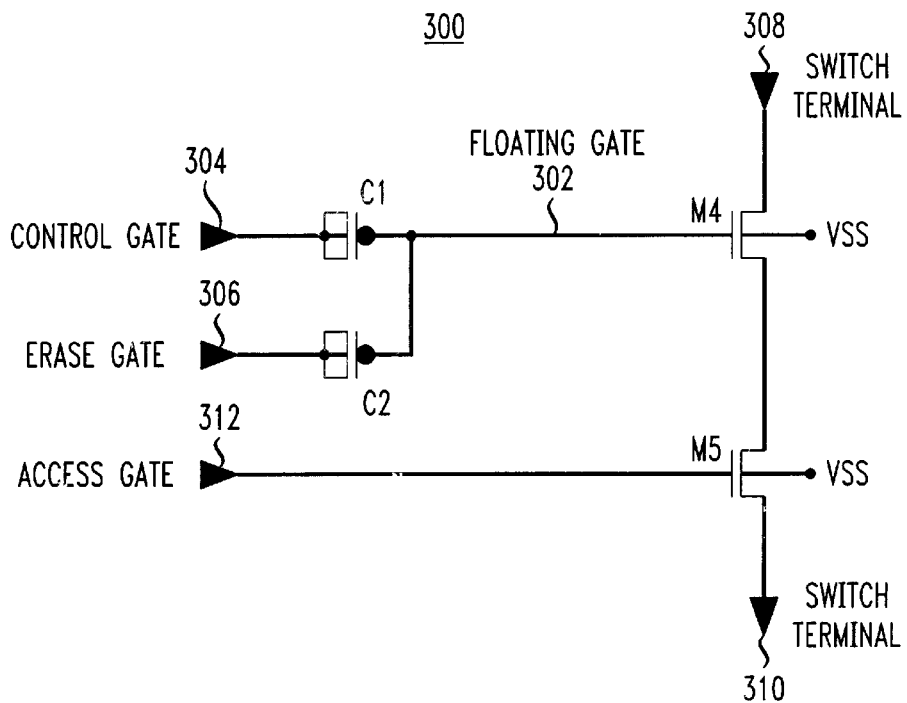
FIG. 5 is a schematic diagram of a non-volatile flash EEPROM memory cell that may be utilized in conjunction with the invention.

FIG. 5 is a schematic diagram of another memory cell 300 that may be configured to utilize a shared erase device in accordance with the invention. The memory cell 300 includes four devices denoted C1, C2, M4 and M5, corresponding to respective control, erase, switch and access devices. Devices C1, C2 and M4 share a common polysilicon floating gate 302.

The control device C1 in this illustrative embodiment may be implemented as a 100 Angstrom gate oxide capacitor, although it should be emphasized that this particular arrangement is by way of example and not limitation. It will be apparent to those skilled in the art that different oxide thicknesses and different structural configurations may be used for device C1 and the other devices described herein.

The source, drain and tub of C1 in the FIG. 5 embodiment are connected together to form control gate terminal 304. The erase device C2 may also be implemented as a 100 Angstrom gate capacitor. Its source, drain and tub are connected together to form erase gate terminal 306. Switch device M4 has switch terminals 308 and 310 associated therewith. Access device M5 has access gate 312 associated therewith, and is arranged between M4 and switch device terminal 310 as shown. Tunnel current for erasure is supplied through C2. In accordance with the invention, device C2 is implemented as a portion of a shared erase device.

Figure 6:
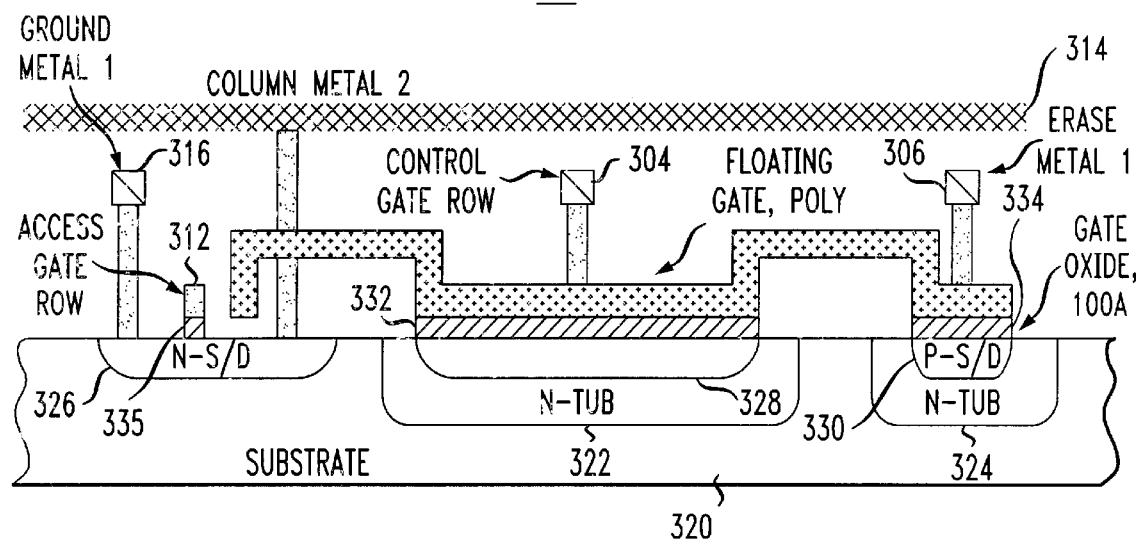
FIG. 6 is a side sectional view of a memory cell configured to utilize a shared erase device in accordance with the invention.

FIG. 6 shows a side sectional view of the memory cell 300. The cell 300 as shown in FIG. 6 includes floating gate 302, control gate 304, erase gate 306 and access gate 312. Also shown is column connection 314 and ground connection 316. The control gate 304, erase gate 306 and ground connection 316 are formed in a first metallization layer denoted Metal 1. The column connection 314 is formed in a second metallization layer denoted Metal 2. The cell 300 is formed on a substrate 320 that includes N-tubs 322 and 324 and an N-type source/drain region 326. P-type source/drain regions 328 and 330 are formed in respective N-tubs 322 and 324. Gate oxide regions 332 and 334 underlie floating gate 302 over respective P-type source/drain regions 328 and 330. A gate oxide region 335 underlies the access gate 312 over the N-type source/drain region 326.

Figure 7:
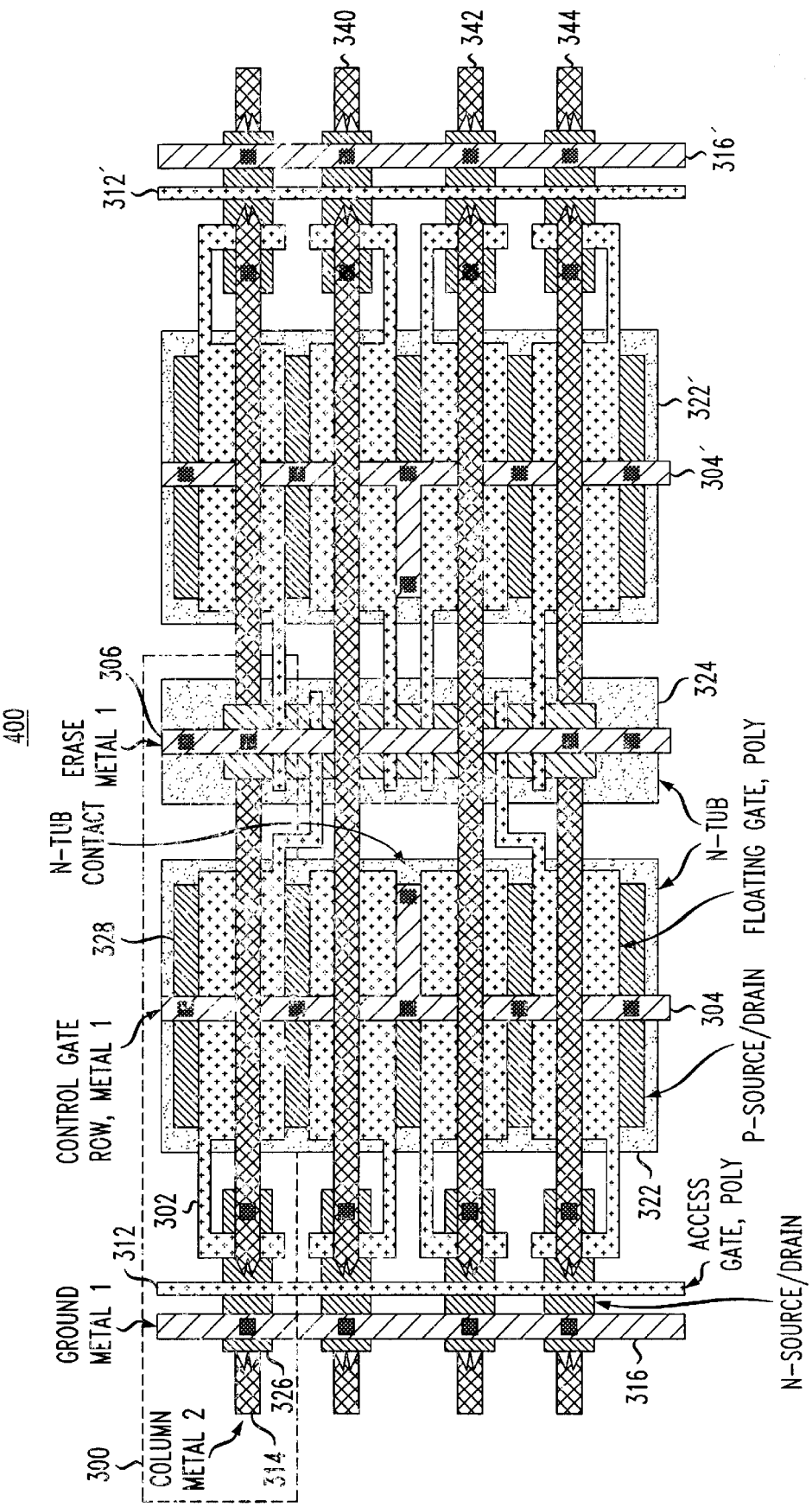
FIG. 7 is a topological diagram of an example eight-cell memory array utilizing a single shared erase device in accordance with the invention.

FIG. 7 shows a memory cell array 400 which includes eight of the memory cells 300 configured substantially as shown in FIG. 6. The cells of the eight-cell array are divided into first and second groups arranged on opposite sides of a shared erase device that is formed in the N-tub 324 and includes Metal 1 erase gate 306. The floating gates of each of the cells extend toward the shared erase gate and form a terminal of a corresponding portion of the shared erase device. The first group of four cells includes a Metal 1 control gate row corresponding to control gate terminal 304, a polysilicon access gate row corresponding to access gate 312, and a Metal 1 ground row corresponding to ground connection 316. The second group of four cells are formed in an N-tub 322' and includes a Metal 1 control gate row 304', a polysilicon access gate row 312' and a Metal 1 ground row 316'. Metal 2 column connections 314, 340, 342 and 344 extend horizontally through the array as shown.

As noted above, the eight cells of the array 400 share the erase device formed in N-tub 324 and having erase gate 306. The shared erase device in this embodiment, like the embodiment of FIGS. 4A and 4B, comprises eight transistors connected in series. These transistors share common source/drain regions contacted only at either end of the shared device.

In an erase operation, a voltage of about 11 volts is applied to the erase gate 306. Because this high erase voltage is applied to the N-tub 324 as well as the source/drain regions, low source/drain-to-tub breakdown voltages can be tolerated, thereby avoiding the need for additional drain implants. The common erase gate 306 may be coupled, e.g., via an external connection to an off-chip high voltage source or via an internal connection to an on-chip high voltage charge pump for application of the erase voltage during the erase operation. The erase voltage is 0 volts at all other times other than during the erase operation.

Program and read operations of the array 400 may be implemented in a well-known conventional manner and are therefore not described in detail herein.

A memory device based on the memory cell array of FIG. 7 may be fabricated in a standard 0.16 $\mu$m CMOS logic process with the addition of the above-noted 100 Angstrom gate oxide for cell devices C1, C2 and M4. This gate oxide thickness provides acceptable charge retention for the floating gate 302. No additional threshold nor drain implants are used. Because devices C1, C2 and M4 have the 100 Angstrom gate oxide, their threshold voltages scale up accordingly to about 1.2 volts. Access device M2 may be a standard 1.5 volt N-channel device. The array may use VDD supplies of 1.5 volts and 3.3 volts. During a read operation, the control gate row high voltage level may be 3.3 volts, derived from the 3.3 volt VDD supply. Using a 3.3 volt row level allows for small control gate capacitor (C1) size. Alternatively, the row high level could be 1.5 volts, a voltage that is not much above the 100 Angstrom gate oxide device threshold of 1.2 volts. In this case, to couple the floating gate high, the amount of gate to source/drain overlap and fringing capacitance would have to be increased, thereby requiring a larger size C1.

As noted above, the erase voltage may be 11 volts during an erase operation and 0 volts at all other times. The program voltage may be 5 volts during a program operation, and may be left at 5 volts or set to 1.5 volts (VDD) during a read operation.

The array 400 may be used to form a wide variety of different memory devices. For example, one possible set of such devices implementable using the array 400 and the above-described fabrication configuration has a maximum size of 144 Kbits, with up to 4K words having a word width from 2 to 72 bits. The maximum number of rows and columns is 128 and 1152, respectively. Column multiplexing may be in a conventional manner by a factor such as 8, 16, 32, etc.

An example array fabricated in the manner described above has a cell size of 1.28 $\mu m \times 10.56$ $\mu m$ (13.5 $\mu m^2$), representing a cell area reduction of about 80% relative to a conventional memory cell.

A memory cell array in accordance with the invention, although particularly well suited for use in embedded memories for processors and other integrated circuits, can be used in a variety of other applications, including, e.g., one-time-programmable (OTP) and few-time-programmable (FTP) applications such as redundancy control in SRAM or DRAM memory elements, security code or ID registers, switch functions, etc.

The particular embodiments of the invention as described herein are intended to be illustrative only. For example, as previously noted, different device conductivity types and circuit structures may be used in other embodiments. In addition, the particular number of cells sharing an erase device may be more or less than the number used in the illustrative embodiments. The structural dimensions, applied voltages and other device parameters described in conjunction with the illustrative embodiments are shown by way of example only, and should not be construed as limiting the scope of the invention in any way. Other embodiments of the invention can use different structural arrangements for implementing memory cell elements such as control devices, erase devices and floating gates. These and numerous other alternative embodiments within the scope of the following claims will be readily apparent to those skilled in the art.

What is claimed is:

1. A non-volatile memory device comprising:
   at least one array of memory cells, each of the memory cells in the array comprising a control device coupled to a switch device via a common floating gate;
   wherein each of at least a subset of the memory cells further comprises a portion of a shared erase device, the portion of the shared erase device associated with a given one of the memory cells being coupled to the switch device of that cell via the floating gate of that cell, the shared erase device being utilizable in performing an erase operation for each of the memory cells associated therewith.

2. The non-volatile memory device of claim 1 wherein the memory cell array comprises an array of EEPROM memory cells.

3. The non-volatile memory device of claim 1 wherein the memory cell array comprises a flash memory array.

4. The non-volatile memory device of claim 1 wherein the memory cell array comprises an array of single-poly memory cells.

5. The non-volatile memory device of claim 1 wherein the array comprises an array of eight memory cells, the shared erase device being configured so as to be shared among the eight memory cells.

6. The non-volatile memory device of claim 5 wherein the eight memory cells are configured in two groups of four cells each, the shared erase device being arranged in a region of the device between the two groups of cells, the floating gates associated with each of the cells extending into the region and forming elements of the shared erase device.

7. The non-volatile memory device of claim 1 wherein the shared erase device is at least partially formed in an N-well region of a P-type substrate.

8. The non-volatile memory device of claim 1 wherein the shared erase device comprises a plurality of source/drain regions and a well tie region, wherein only a subset of the plurality of source/drain regions have contacts associated therewith.

9. The non-volatile memory device of claim 1 wherein the shared erase device comprises a series connection of transistors each having a separate erase gate of one of the memory cells associated therewith, wherein only two endmost transistors in the series connection of transistors have source/drain contacts associated therewith.

10. A non-volatile memory cell comprising:
    a control device;
    a switch device; and
    a floating gate, the control device being coupled to the switch device via the floating gate;
    wherein the memory cell further includes a portion of a shared erase device, the erase device being shared with one or more additional memory cells, the portion of the shared erase device being coupled to the switch device via the floating gate, the shared erase device being utilizable in performing an erase operation for the memory cell.

11. An integrated circuit comprising at least one non-volatile memory device, the non-volatile memory device comprising one or more arrays of memory cells, each of the memory cells in a given one of the arrays comprising a control device coupled to a switch device via a-common floating gate, wherein each of at least a subset of the memory cells of the given array further comprises a portion of a shared erase device, the portion of the shared erase device associated with a given one of the memory cells of the given array being coupled to the switch device of that cell via the floating gate of that cell, the shared erase device being utilizable in performing an erase operation for each of the memory cells associated therewith.

* * * * *